(12) United States Patent
Bassom

(10) Patent No.: US 9,134,074 B2
(45) Date of Patent: Sep. 15, 2015

(54) METHOD AND APPARATUS FOR THERMAL CONTROL OF ION SOURCES AND SPUTTERING TARGETS

(71) Applicant: Varian Semiconductor Equipment Associates, Inc., Gloucester, MA (US)

(72) Inventor: Neil J. Bassom, Hamilton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 308 days.

(21) Appl. No.: 13/645,006

(22) Filed: Oct. 4, 2012

(65) Prior Publication Data

US 2014/0099782 A1     Apr. 10, 2014

(51) Int. Cl.
| | |
|---|---|
| H01J 27/08 | (2006.01) |
| F28D 15/04 | (2006.01) |
| F28D 15/02 | (2006.01) |
| H01J 37/02 | (2006.01) |
| H01J 37/317 | (2006.01) |

(52) U.S. Cl.
CPC ........ F28D 15/0266 (2013.01); F28D 15/0275 (2013.01); F28D 15/0283 (2013.01); F28D 15/04 (2013.01); H01J 27/08 (2013.01); H01J 37/02 (2013.01); H01J 37/3171 (2013.01); H01J 2237/002 (2013.01)

(58) Field of Classification Search
CPC .......... H01J 27/08; H01J 37/08; H01J 49/12; H01J 2237/002; F28D 15/02; F28D 15/0275; F28D 15/04

USPC .................................... 250/426; 165/104.26
See application file for complete search history.

(56) References Cited

U.S. PATENT DOCUMENTS

| | | | |
|---|---|---|---|
| 2,677,770 A | 5/1954 | Smyth et al. | |
| 6,844,556 B2 | 1/2005 | Kinoyama | |
| 6,958,481 B2 | 10/2005 | Horsky et al. | |
| 2004/0000647 A1* | 1/2004 | Horsky | 250/427 |
| 2010/0213851 A1* | 8/2010 | Chang Diaz | 315/111.41 |

OTHER PUBLICATIONS

Grover, G.M., et al., Structures of Very High Thermal Conductance, Journal of Applied Physics, pp. 1990-1991, vol. 35, Issue 6, Melville, New York USA.

* cited by examiner

*Primary Examiner* — Jack Berman
*Assistant Examiner* — Kevin Chung
(74) *Attorney, Agent, or Firm* — Kacvinsky Daisak Bluni PLLC

(57) ABSTRACT

A method and apparatus are disclosed for controlling a semiconductor process temperature. In one embodiment a thermal control device includes a heat source and a housing comprising a vapor chamber coupled to the heat source. The vapor chamber includes an evaporator section and a condenser section. The evaporator section has a first wall associated with the heat source, the first wall having a wick for drawing a working fluid from a lower portion of the vapor chamber to the evaporator section. The condenser section coupled to a cooling element. The vapor chamber is configured to transfer heat from the heat source to the cooling element via continuous evaporation of the working fluid at the evaporator section and condensation of the working fluid at the condenser section. Other embodiments are disclosed and claimed.

5 Claims, 7 Drawing Sheets

METHOD AND APPARATUS FOR THERMAL CONTROL OF ION SOURCES AND SPUTTERING TARGETS

FIELD OF THE DISCLOSURE

Embodiments of the present disclosure relate to the field of substrate processing. More particularly, the present disclosure relates to an improved method and apparatus for thermal control of ion sources and sputtering targets.

BACKGROUND OF THE DISCLOSURE

Ion implantation is a standard technique for introducing conductivity-altering impurities into a workpiece such as a wafer or other substrate. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

For arc discharge ion sources the outputs of some species (e.g. $BF_2+$ ions from $BF_3$ plasma and molecular ions from molecular feeds) are improved if the ion source is operated at cooler temperatures. To take advantage of this, various sources have been designed to improve source cooling. Implementations of cooler sources have relied on a variety of techniques. Some simply increase the cooling capacity of the cooling fluid in the ion source region (e.g. larger cooling channels, using higher rates of flow, reducing the temperature of incoming cooling fluid). Others reduce the thermal resistance between the heat production and heat sink regions of the ion source by moving the cooling closer to the plasma chamber (or by flowing coolant through the walls of the plasma chamber itself) so that a smaller temperature difference is required to drive a given heat flow. Still others reduce the thermal resistance between the heat production region and heat sink regions of the ion source by increasing the cross section through which the heat flows.

FIG. 1 shows a partial cutaway view of a portion of a conventional cooling arrangement for an ion source. An arc chamber 300 is thermally coupled to a cooling flange 302 of a cooling chamber 304 via a bar element 306. The bar element 306 is made from a metal or other material having desired conduction heat transfer characteristics. The cooling flange 302 may be coupled to a heat sink or a source of cooling fluid. As arranged, heat generated in the arc chamber 300 is conducted through the wall of the arc chamber, through the bar element 306, to the forward flange 302 of the cooling chamber 304. Heat is removed from the forward flange via the cooling fluid that may be circulated through or against the flange.

The effectiveness of such approaches is limited by the generally low thermal conductivities of the refractory materials which must be used in the ion source region, and the significant impediments to heat flow presented by the interfaces between different materials.

An additional limitation to such approaches, when using ion sources that are not dedicated to a single species, is that for some species (e.g., P+ ions from a $PH_3$ feed and C+ ions from a $CO_2$ feed) the output and lifetime of the source are improved by operating the source as hot as possible. The ability to switch between high and low temperatures would thus be advantageous. When the thermal resistance between plasma chamber and cooling surface has been lowered by mechanical changes frozen into the design this becomes difficult.

In view of the forgoing, it would be advantageous to provide a system and method for controlling the temperature of an ion source so that the operating temperature of the source can be cooled when using species whose outputs are improved by cooler temperatures, and so that operating temperature of the source can be allowed to rise when using species whose outputs are improved by higher temperatures.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

This disclosed system and method improve upon prior thermal control approaches by using heat pipe technology to improve source cooling. The disclosure replaces thermal conduction through a solid material between the arc chamber and a cooling surface using a combination of evaporation, gas transport, and condensation. The disclosure also enables the elimination of interfaces between the arc chamber and cooled surface. The disclosure further enables operation of the system in a hot mode, with heat loss from the arc chamber attributed almost entirely to radiation heat transfer. The disclosure facilitates the desired thermal control without requiring mechanical changes to the ion source, thus enabling switching between cool and hot modes.

It will be appreciated that the disclosed system and method may also be used to improve cooling of other elements of process equipment subject to heating, such as wafer platens and sputter targets.

A thermal control device is disclosed, comprising a heat source and a housing comprising a vapor chamber coupled to the heat source. The vapor chamber may include an evaporator section and a condenser section. The evaporator section may have a first wall associated with the heat source. The first wall may have a wick for drawing a working fluid from a lower portion of the vapor chamber to the evaporator section. The condenser section may be coupled to a cooling element. The vapor chamber may be configured to transfer heat from the heat source to the cooling element via continuous evaporation of the working fluid at the evaporator section and condensation of the working fluid at the condenser section.

A thermal control device is disclosed for semiconductor processing. The thermal control device may include a heat source comprising an arc chamber or a sputter target, and a housing including a vapor chamber. The housing may be coupled to the heat source at an evaporator section. The housing may also be coupled to a cooling element at a condenser section. The evaporator section may have a wick for drawing a working fluid from a lower portion of the vapor chamber to the evaporator section. The condenser section may be configured for condensing the working fluid via heat transfer to the cooling element. The vapor chamber may be configured to transfer heat from the heat source to the cooling element via continuous evaporation and condensation of the working fluid.

A method is disclosed for controlling temperature as part of a semiconductor manufacturing process. The method may include controlling the temperature of a semiconductor manufacturing process surface using a vapor chamber coupled to the process surface. The vapor chamber may comprise an evaporator section adjacent the process surface and a condenser section adjacent a cooling element. The vapor chamber may further including a wick disposed in or on a wall of the evaporator section. The vapor chamber may be configured to receive a working fluid therein. Controlling the temperature may comprise evaporating the working fluid at the evaporator section and cooling the working fluid at the condenser section to transfer heat from the process surface to the cooling element.

BRIEF DESCRIPTION OF THE DRAWINGS

By way of example, specific embodiments of the disclosed device will now be described, with reference to the accompanying drawings, in which.

DETAILED DESCRIPTION

Figure 1:
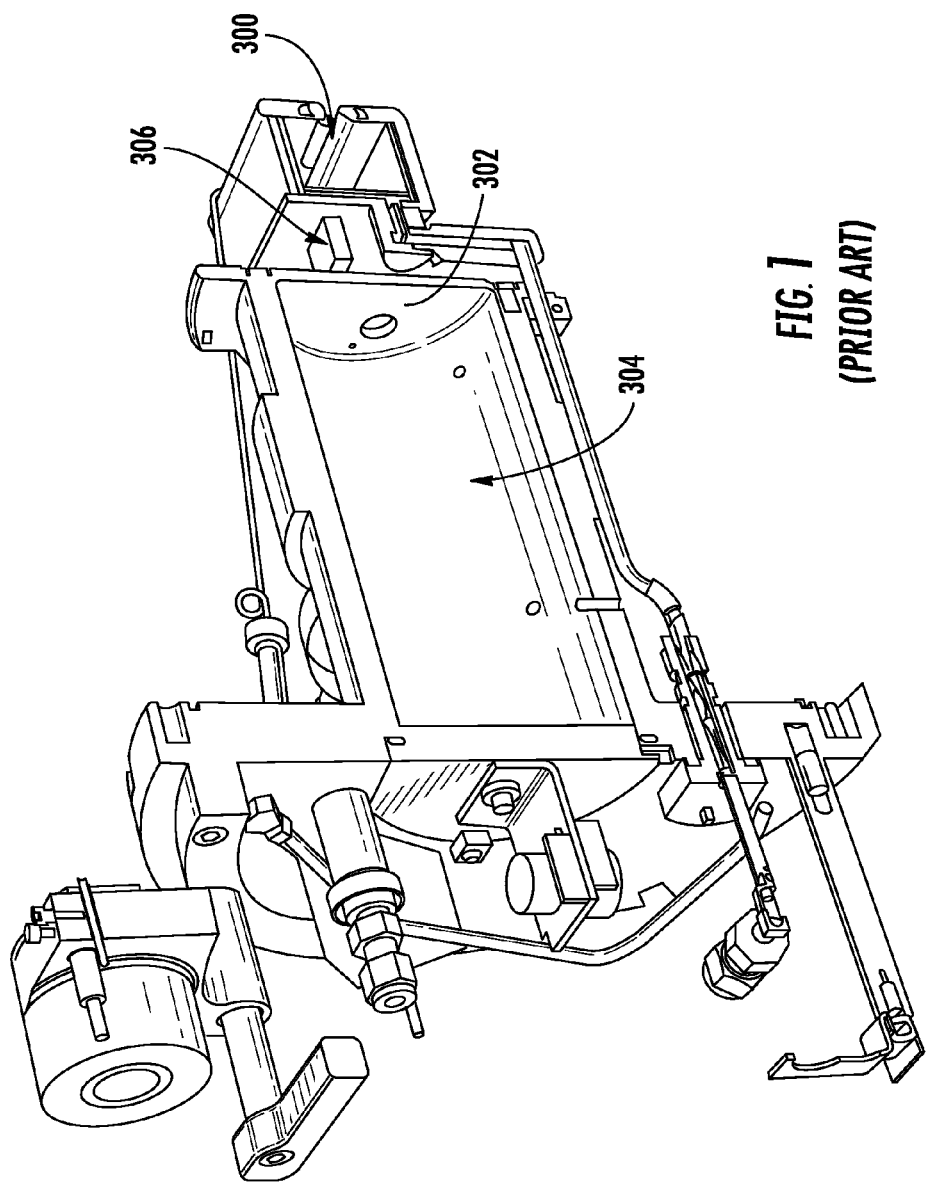
FIG. 1 is a cutaway view of a portion of an ion chamber cooling arrangement for use with a beam-line ion implanter.
Figure 2:
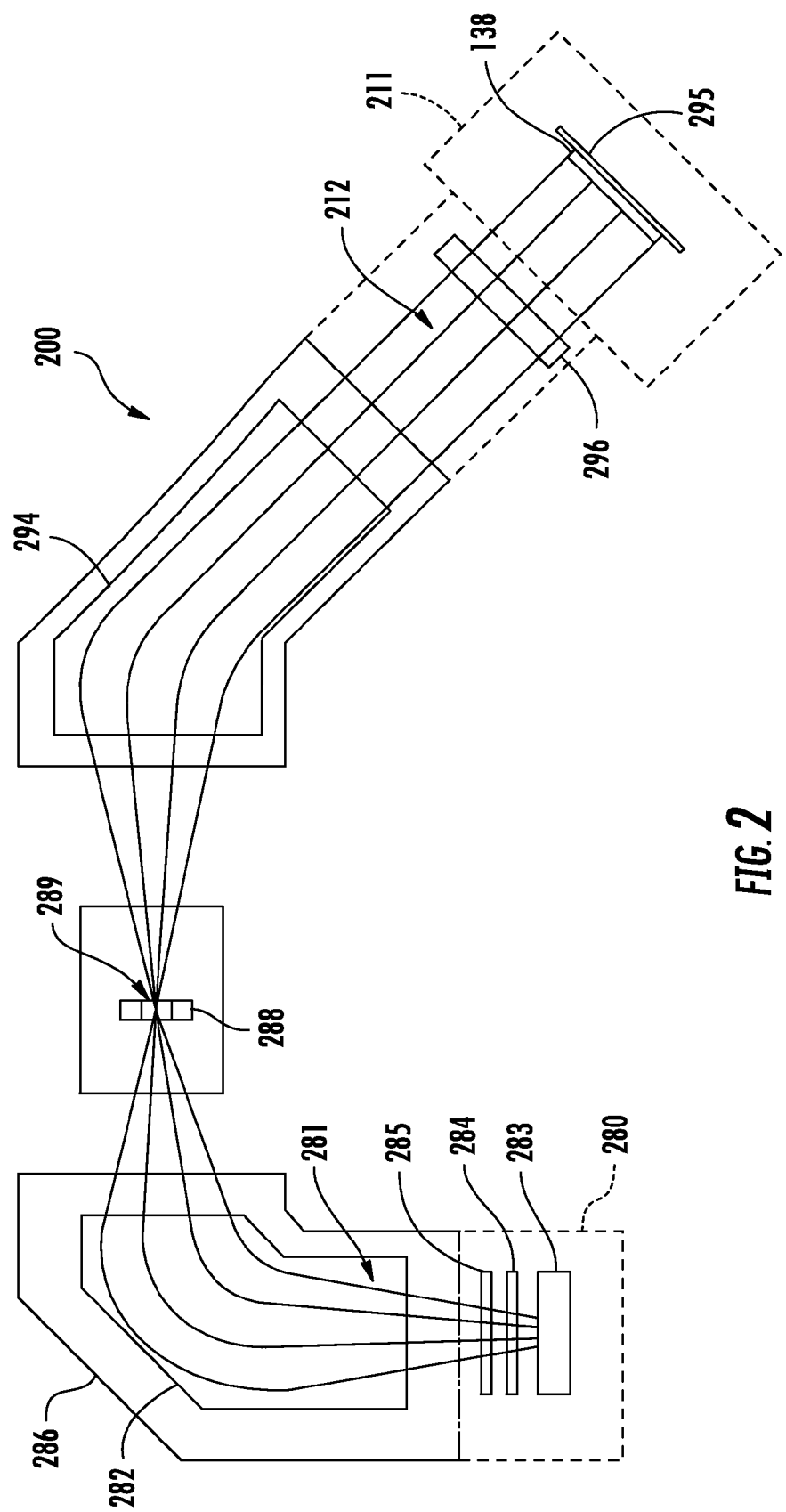
FIG. 2 is a block diagram of a beam-line ion implanter.

The disclosed systems and methods are described in connection with an ion implanter. The implanter can be used with any of a variety of substrates. Thus, the invention is not limited to the specific embodiments described below. FIG. 2 is a block diagram of a beam-line ion implanter 200. In one instance, this implanter 200 may be for doping a solar substrate. Those skilled in the art will recognize that the beam-line ion implanter 200 is only one of many examples of beam-line ion implanters that can produce ions. Thus, the systems and methods described herein are not limited solely to the beam-line ion implanter 200 of FIG. 2. In addition, it is understood that the ion implanter is not restricted to "beam-line" designs, and could include implanters based on plasma immersion, flood or other plasma source designs.

In general, the beam-line ion implanter 200 includes an ion source 280 to generate ions for forming an ion beam 281. The ion source 280 may include an arc chamber 283 where a feed gas supplied to the arc chamber 283 is ionized. This gas may be or may include or contain hydrogen, helium, other rare gases, oxygen, nitrogen, arsenic, boron, phosphorus, aluminum, indium, gallium, antimony, carborane, alkanes, another large molecular compound, or other p-type or n-type dopants. The generated ions may be extracted from the arc chamber 283 by a series of extraction electrodes to form ion beam 281. In particular, the ions may be extracted from chamber 283 by an extraction electrode part of which is formed by the exit aperture of chamber 283, suppression electrode 284 and ground electrode 285. The ion beam 281 is mass analyzed by mass analyzer 286 which includes a resolving magnet 282 and a mass resolving slit 288 having a resolving aperture 289. The resolving magnet 282 deflects ions in the ion beam 281 such that only ions having a desired mass to charge ratio associated with a particular dopant ion species pass through resolving aperture 289. The undesired ion species do not pass through the resolving aperture 289, since they are blocked by the mass resolving slit 288.

Ions of the desired ion species pass through resolving aperture 289 to the angle corrector magnet 294. The angle corrector magnet 294 deflects ions of the desired ion species and converts the ion beam from a diverging ion beam to ribbon ion beam 212, which has substantially parallel ion trajectories. The beam-line ion implanter 200 may further include acceleration and/or deceleration units in some embodiments. Acceleration and deceleration units are used in ion implant systems to speed up or slow down the ion beam. Speed adjustment is accomplished by applying specific combinations of voltage potentials to sets of electrodes disposed on opposite sides of the ion beam. As the ion beam passes between the electrodes, ion energies are increased or decreased depending on the applied voltage potentials. Since the depth of an ion implant is proportional to the energy of the impinging ion beam, beam acceleration may be desirable when performing deep ion implants. Conversely, where shallow ion implants are desired, beam deceleration is performed to ensure the impinging ions travel only a short distance into the workpiece. The illustrated embodiment includes a deceleration unit 296.

An end station 211 includes a platen 295 configured to support one or more workpieces, such as substrate 138, which is disposed in the path of ribbon ion beam 212, such that ions of the desired species are implanted into the substrate 138. The substrate 138 may be, for example, a semiconductor wafer, solar cell, etc. The end station 211 also may include a scanner (not shown) for moving the substrate 138 perpendicular to the long dimension of the ribbon ion beam 212 cross-section, thereby distributing ions over the entire surface of the substrate 138. Although a ribbon ion beam 212 is illustrated, other embodiments may provide a spot beam. It will be understood to those skilled in the art that the entire path traversed by the ion beam is evacuated during ion implantation. The beam-line ion implanter 200 may also include additional components known to those skilled in the art and may incorporate hot or cold implantation of ions in some embodiments.

Figure 3:
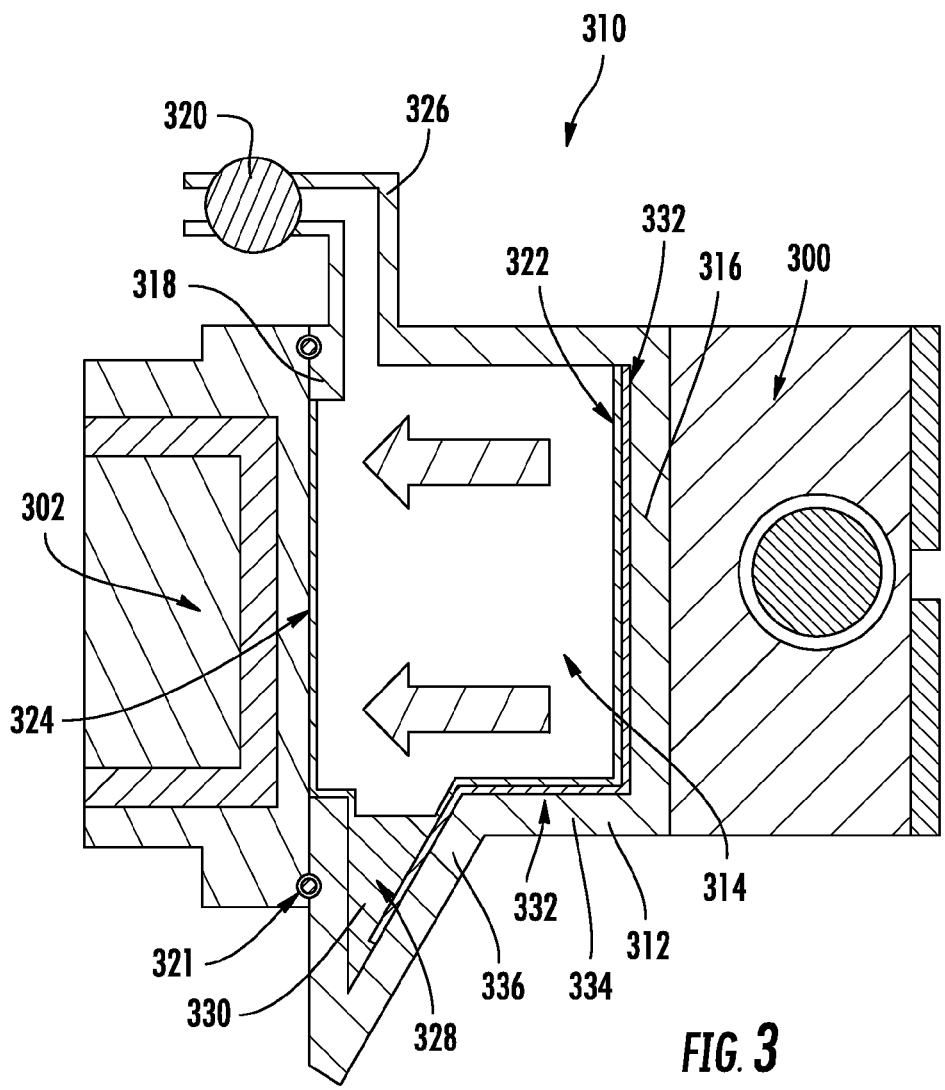
FIG. 3 is a cross-section view of an embodiment of the disclosed thermal control system.

FIG. 3 is a cross-section view of an exemplary thermal control device 310 consistent with the present disclosure for use with the arc chamber 300. The thermal control device 310 may be disposed between the arc chamber 300 and cooling flange 302 to provide heat transfer therebetween. The thermal control device 310 may comprise a housing 312 having a vapor chamber 314 formed by a plurality of interior walls. A forward wall 316 may be coupled directly to a wall of the arc chamber 300 so that heat may be conducted directly from the arc chamber to the forward wall. A rear wall 318 may be coupled to the cooling flange 302 so that heat may be conducted directly from the rear wall 318 to the cooling flange 302. The cooling flange 302 may be coupled to a source of cooling fluid to maintain the flange at a desired temperature during operation of the system 310.

Any of a variety of techniques may be used to couple the forward and rear walls to the arc chamber and cooling flange, including clamping, bolting, welding, brazing and the like. In addition, heat transfer promoting materials (e.g., adhesives, sealants) may be disposed in the interfaces between these surfaces, as desired.

The vapor chamber 314 may be sealed from the outside environment, and may include a pressure relieve valve 320 to prevent overpressurization during hot operation of the system.

A vacuum seal 321 is provided between the housing 312 and the cooling flange 302 to provide a tight connection between the two, so the only materials interface is between the top of the cooling unit and the base of the arc chamber. Interfaces may be entirely eliminated if a single titanium piece is used to fabricate both the arc chamber 300 and housing 312.

The vapor chamber 314 may be configured to efficiently transfer heat from the arc chamber 300 to the cooling flange 302 during operation. Thus, the vapor chamber may have an evaporator section 322 disposed adjacent to the arc chamber 300 and a condenser section 324 disposed adjacent to the cooling flange 302. The pressure relief valve 320 may be coupled to the vapor chamber 314 via a relief line 326 disposed in an upper portion of the chamber.

The vapor chamber 314 may further include a reservoir 328 disposed in a lower portion of the chamber. The reservoir 328 may be configured to hold a quantity of working fluid 330. The working fluid 330 may be any of a variety of appropriate fluids used in heat pipe arrangements, a non-limiting list of which includes water, ethanol, acetone, sodium, helium, nitrogen, ammonia, acetone, methanol, Flutek PP2, toluene, mercury, lithium and silver. The vapor chamber itself 314 may be made from a material that is compatible with the working fluid, such as stainless steel, titanium, aluminum, copper, tantalum, and tungsten. A pump may be used to remove air from the vapor chamber 314, for example, via the relief line 326, prior to introduction of the working fluid 330 into the reservoir 328. The working fluid 330 may be introduced into the vapor chamber via the pressure relief line 326 or other appropriate connection.

The evaporator section 322 of the vapor chamber 314 may include a wick 332 disposed on at least a portion of the forward wall 316. In the illustrated embodiment, the wick 332 is also disposed on a portion of a bottom wall 334 as well as a wall 336 of the reservoir 328 to provide a capillary connection between the reservoir and the evaporator section 322. The wick 332 may be any of a variety of wick materials and configurations used in heat pipes. A non-limiting exemplary listing of of appropriate wicks for use in the disclosed system 310 include sintered metal powder wicks, grooved wicks and metal mesh wicks.

Thus arranged, the wick 332 may exert capillary pressure on a liquid phase of the working fluid 330 to draw liquid working fluid from the reservoir 328 to the front wall 316 of the vapor chamber 314. The vapor chamber 314 provides evaporative cooling to transfer thermal energy from the arc chamber 300 to the cooling flange 302 by the evaporation and condensation of the working fluid. When the forward wall 316 is heated via conduction from the arc chamber 300, the working fluid inside the wick 332 on the forward wall 316 evaporates and increases the vapor pressure inside the vapor chamber 314. Latent heat of evaporation absorbed by the vaporization of the working fluid thus reduces the temperature at the forward wall (and the arc chamber).

The evaporated working fluid travels to the condenser section where the vapor condenses, releases its latent heat, and warms the rear wall 318 of the chamber. The condensed working fluid then flows down the rear wall 318 under the force of gravity, where it is collected in the reservoir 328. The liquid working fluid 330 may then be wicked up to the evaporator section 322 to continue the cooling cycle.

Although the illustrated embodiment shows the wick 332 on portions of the forward wall 316, the bottom wall 334 and reservoir wall 336, other wick arrangements are also contemplated. In addition, different combinations of wicks can be used on one or more of the aforementioned walls. It is also contemplated that a discrete reservoir 328 may not be used such that condensed liquid working fluid may be collected along the bottom wall 334 of the vapor chamber 314.

In one non-limiting exemplary embodiment, the working fluid 330 is water, and the housing 312 is formed of titanium. The wick 332 may also be titanium.

Figure 4:
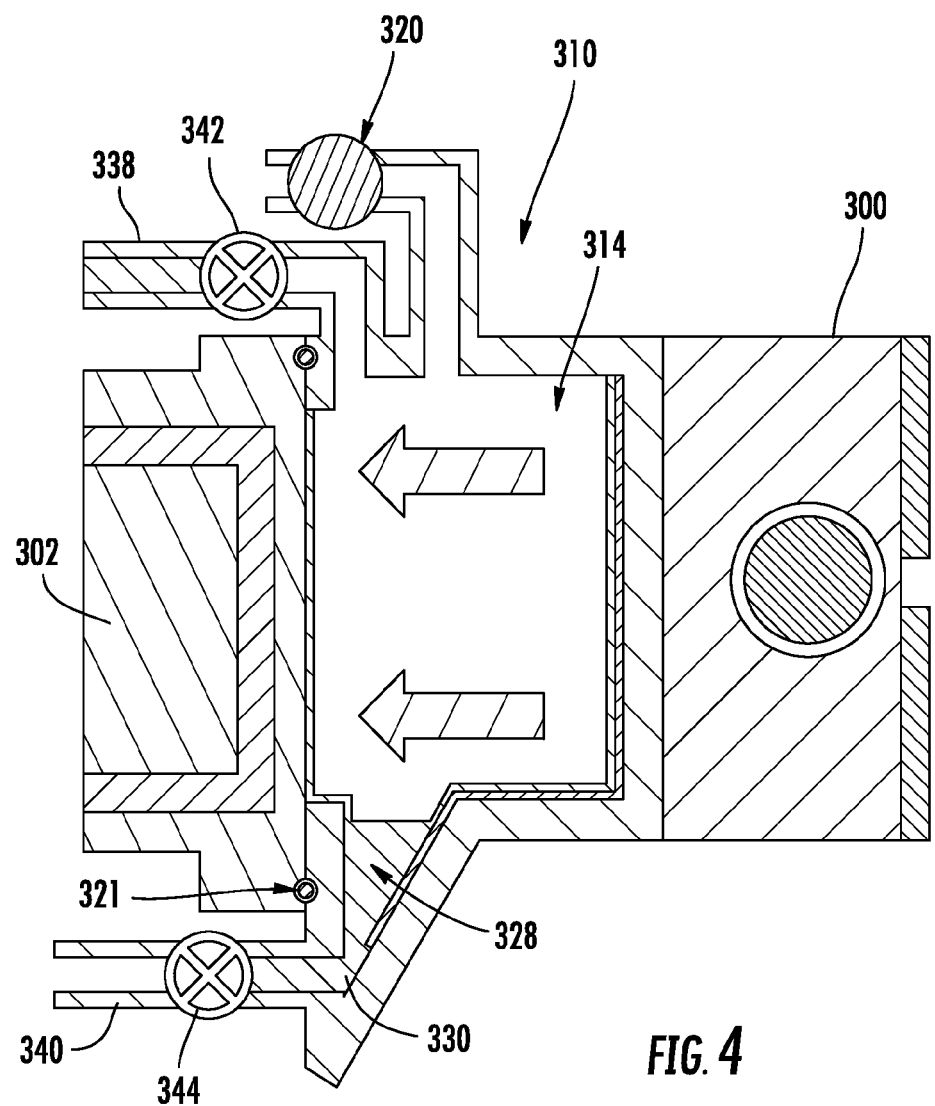
FIG. 4 is a cross-section view of another embodiment of the disclosed thermal control system.

FIG. 4 shows an embodiment of the thermal control system 310 which may be used for both cooling and hot operations. Thus, the system 310 includes the further a fill and drain arrangement to enable working fluid 330 to be introduced into the vapor chamber 314, and to be drained from the vapor chamber 314, as desired. Thus, a fill line 338 may be provided in an upper portion of the vapor chamber 314, while a drain line 340 may be provided in a lower portion of the vapor chamber. In the illustrated embodiment, the fill line is coupled to the top of the vapor chamber 314 while the drain line 340 is coupled to the reservoir 328. It will be appreciated that these locations are not critical. In addition, it is contemplated that only a single line may be used for both filling and draining. Thus, the single line could be positioned near the top of the vapor chamber 314, and removal of working fluid from the chamber could be facilitated by heating the chamber and allowing the evaporated working fluid to be vented via the single line. A control system may be employed to operate the fill and drain valves.

Fill and drain valves 342, 344 may be provided in the fill and drain lines 338, 340, respectively. These fill and drain valves 342, 344 can be any type of valve desired, including globe valves, needle valves, gate valves, ball valves and the like.

In addition to enabling efficient filling and draining of working fluid, the FIG. 4 arrangement also enables the thermal control system 310 either with or without a working fluid. As previously noted, some throughput associated with some ion species is enhanced when the ion source (arc chamber) is cooled, while for other ion species throughput is enhanced when the ion source (arc chamber) is hot. Thus, the disclosed system 310 enables both modes of operation. When a working fluid is employed, cooling of the arc chamber occurs in the manner previously described. When "hot" operations are desired (for those ion species for which enhanced throughput is obtained at relatively high temperatures), the working fluid is drained and the only mode of heat transfer away from the arc chamber 300 would be through the walls of the chamber and the attached system 310. During hot operation the vapor chamber 314 would be vented to chamber vacuum.

Figure 5:
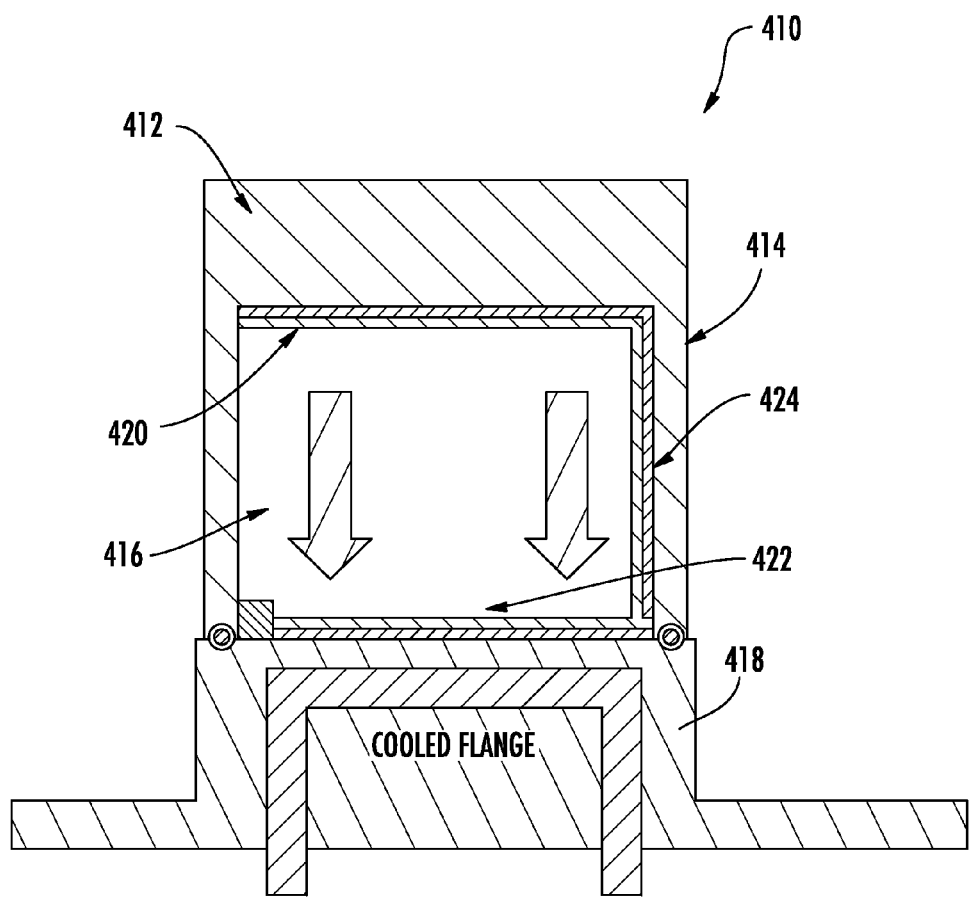
FIG. 5 is a cross-section view of a further embodiment of the disclosed thermal control system.

FIG. 5 shows an embodiment of the disclosed thermal control system 410 for use with a sputter target 412 in lieu of an arc chamber. The components of the thermal control system 410 are substantially the same as the thermal control system 310 described in relation to FIGS. 3 and 4. In this embodiment, however, the system 410 is formed integrally with the sputter target 412 such that the housing portion 414 and the sputter target are a single piece. The advantage of such an arrangement is that it eliminates the mechanical connection between the heat source and the housing which can otherwise reduce heat transfer between the two. Thus, the illustrated arrangement may provide more efficient cooling of the sputter target 412 as compared to arrangements in which the target is mechanically coupled to the housing. It will be appreciated that this arrangement can also be implemented in the embodiments of FIGS. 3 and 4.

The housing portion 414 may include a vapor chamber 416, the housing coupled between the sputter target 412 and a cooling flange 418. The vapor chamber 416 may includes an evaporator section 420 disposed directly adjacent the sputter target 412, and a condenser section 422 disposed directly adjacent the cooling flange 418. A wick 424 is positioned on a plurality of walls of the vapor chamber 416 spanning from the evaporator section 420 to the condenser section 422. The wick 424 may be any of a variety of wick designs and materials, as described in relation to the previous embodiments.

Thus arranged, a working fluid (not shown) may be introduced into the vapor chamber 416, and cooling of the sputter target 412 may occur through the evaporation/condensation cycle as previously described in relation to the embodiment of FIGS. 3 and 4. It is noted that this embodiment does not include a discrete reservoir. Rather, condensed working fluid is collected in the condenser section 422, and is wicked up to the evaporator section 420 via the wick 424.

Figure 6:
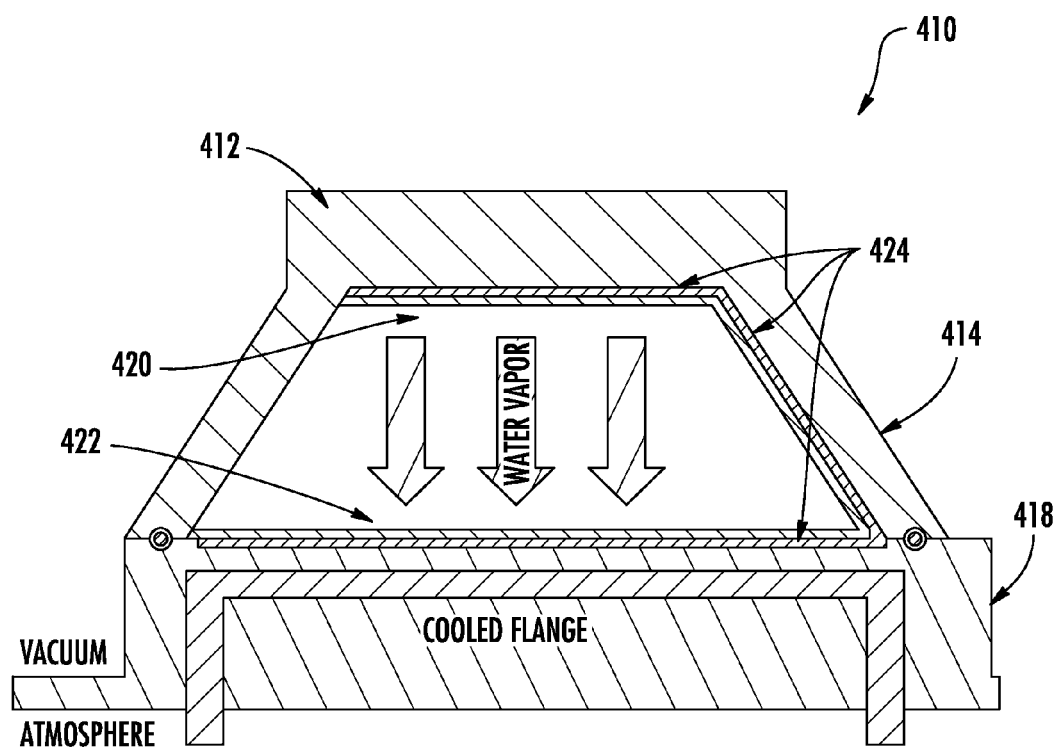
FIG. 6 is a cross-section view of an additional embodiment of the disclosed thermal control system.

FIG. 6 shows an embodiment that is similar to the embodiment of FIG. 5 with the exception that the housing 414 may have a condenser section 422 with a heat transfer area that is substantially greater than that of the evaporator section 420. Such an arrangement may spread the heat flux from the sputter target 412 over a wider cooling area of the cooling flange 418, thus enabling higher power to be dumped into the target during sputtering.

Figure 7:
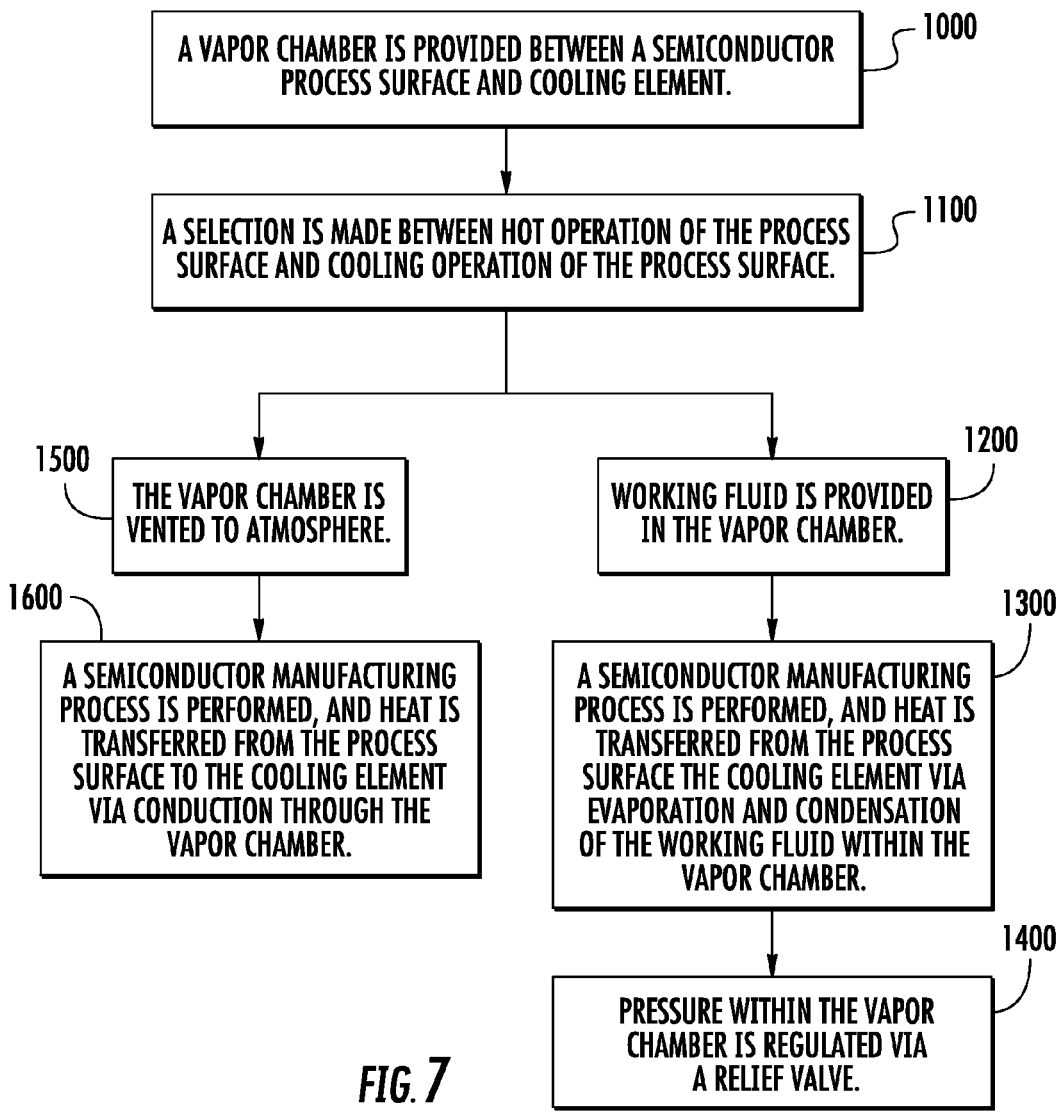
FIG. 7 is a flow diagram illustrating a method of using the disclosed thermal control system.

FIG. 7 is a flow chart illustrating an exemplary method of operating the systems described in relation to FIGS. 1-5. At step 1000 a vapor chamber is provided between a semiconductor process surface and a cooling element. The vapor chamber includes an evaporator section and a condenser section. The evaporator section is positioned adjacent to the process surface and the condenser section is positioned adjacent the cooling element. At step 1100, a selection is made between hot operation and cooling operation. If cooling operation is selected, then at step 1200 working fluid is provided in the vapor chamber. At step 1300, a semiconductor manufacturing process is performed, and heat is transferred from the process surface the cooling element via evaporation and condensation of the working fluid within the vapor chamber. At step 1400, pressure within the vapor chamber is regulated via a relief valve. If, at step 1100, hot operation is selected, then at step 1500, the vapor chamber is vented to chamber vacuum. At step 1600 a semiconductor manufacturing process is performed, and heat is transferred from the process surface the cooling element via conduction through the vapor chamber.

It will be appreciated that the disclosed system and method can provide improved source cooling, which in turn can improve beam currents, which would be beneficial for ion sources generally. The ability to switch to hot operation would also be useful to improve C+ and P+ operation in general purpose sources and enable switching between optimized operating conditions with a source change.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An ion source comprising:
   an arc chamber;
   a thermal control device having a housing including a vapor chamber, the housing coupled to the arc chamber at an evaporator section, the housing coupled to a cooling element at a condenser section, the evaporator section having a wick for drawing a working fluid from a lower portion of the vapor chamber to the evaporator section, the condenser section for condensing the working fluid via heat transfer to the cooling element;
   wherein the vapor chamber is configured to transfer heat from the arc chamber to the cooling element via continuous evaporation and condensation of the working fluid.

2. The thermal control device of claim 1, further comprising a fluid connection to the housing, the fluid connection for introducing the working fluid into the vapor chamber.

3. The thermal control device of claim 1, further comprising a reservoir disposed at a lower portion of the vapor chamber, the reservoir for holding working fluid in liquid form, at least a portion of the reservoir comprising a wick associated with the wick of the evaporator section.

4. The thermal control device of claim 1, wherein the arc chamber and the housing are formed as an integral piece, and wherein the evaporator section comprises a wall having a first area and the condenser section comprises a wall having a second area, the second area being substantially larger than the first area.

5. The thermal control device of claim 1, wherein the housing and the cooling element are coupled via a vacuum seal.

* * * * *